(12) United States Patent
Smith et al.

(10) Patent No.: US 10,418,380 B2
(45) Date of Patent: Sep. 17, 2019

(54) HIGH-VOLTAGE TRANSISTOR DEVICE WITH THICK GATE INSULATION LAYERS

(71) Applicant: GLOBALFOUNDRIES Inc., Grand Cayman (KY)

(72) Inventors: Elliot John Smith, Dresden (DE); Nigel Chan, Dresden (DE); Nilesh Kenkare, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 129 days.

(21) Appl. No.: 15/664,061

(22) Filed: Jul. 31, 2017

(65) Prior Publication Data

US 2019/0035815 A1 Jan. 31, 2019

(51) Int. Cl.
*H01L 21/8234* (2006.01)
*H01L 27/12* (2006.01)
*H01L 21/84* (2006.01)
*H01L 21/266* (2006.01)

(52) U.S. Cl.
CPC ........ *H01L 27/1207* (2013.01); *H01L 21/266* (2013.01); *H01L 21/823462* (2013.01); *H01L 21/84* (2013.01); *H01L 21/823468* (2013.01); *H01L 21/823481* (2013.01)

(58) Field of Classification Search
CPC ... H01L 27/1207; H01L 21/84; H01L 21/266; H01L 21/823462; H01L 21/823481; H01L 21/823468; H01L 21/823857; H01L 21/02225; H01L 21/02227; H01L 21/0223; H01L 21/02233; H01L 29/4232; H01L 29/42364
See application file for complete search history.

(56) References Cited

U.S. PATENT DOCUMENTS

2006/0258110 A1* 11/2006 Pelella ............ H01L 21/823481
438/311

* cited by examiner

*Primary Examiner* — Joseph C. Nicely
*Assistant Examiner* — Pavel G Ivanov
(74) *Attorney, Agent, or Firm* — Amerson Law Firm, PLLC

(57) ABSTRACT

A method of forming a semiconductor device is provided including the steps of providing a silicon-on-insulator (SOI) substrate comprising a semiconductor bulk substrate, a buried insulation layer formed on the semiconductor bulk substrate and a semiconductor layer positioned on the buried insulation layer, and forming a first transistor device, wherein forming the first transistor device includes forming a channel region in the semiconductor bulk substrate and forming a gate insulation layer over the channel region partially of a part of the buried insulation layer and wherein forming the gate insulation layer includes oxidizing a part of the semiconductor layer.

12 Claims, 7 Drawing Sheets

HIGH-VOLTAGE TRANSISTOR DEVICE WITH THICK GATE INSULATION LAYERS

BACKGROUND

1. Field of the Disclosure

Generally, the subject matter disclosed herein relates to integrated circuits, and, more particularly, to transistor devices comprising thick gate insulation layers (such as oxide layers) allowing for a relatively high-voltage operation.

2. Description of the Related Art

Integrated circuits formed on semiconductor wafers typically include a large number of circuit elements, which form an electric circuit. In addition to active devices such as, for example, field effect transistors and/or bipolar transistors, integrated circuits may include passive devices such as resistors, inductors and/or capacitors. In particular, during the fabrication of complex integrated circuits using CMOS technology, millions of transistors, i.e., N-channel transistors and P-channel transistors, are formed on a substrate including a crystalline semiconductor layer.

A MOS transistor, for example, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin gate insulating layer. The conductivity of the channel region, upon formation of a conductive channel due to the application of an appropriate control voltage to the gate electrode, depends on, among other things, the dopant concentration, the mobility of the majority charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors.

For rectifying and/or switching applications, high-voltage transistors are needed. Particularly, there is an increasing demand in semiconductor manufacturing to integrate high-voltage devices with high-performance (e.g., low voltage, high speed) devices and high-yield conventional bulk transistor devices for system on chip applications. Such integrated devices are useful in, for example, analog and mixed signal applications.

However, in practice, integrating high-voltage and high-performance devices (Fully Depleted) SOI FETs (Semiconductor-on-Insulator Field Effect Transistors) has proven problematic due in part to the differences in dimensional scaling of the respective devices. Involved patterning procedures are needed that significantly increase the overall manufacturing complexity. In addition, due to present constraints caused by the gate insulation layer (e.g., oxide materials) in use today, there are significant processing challenges to having gate insulation layers (e.g., oxide materials) on the same die that support both high-performance low-voltage transistor devices and high-voltage transistor devices that operate at voltages that may exceed 5 or 10 V. This is due in part to the fact that a gate insulation layer on a particular die is typically optimized for either a high-performance device or a high-voltage device, but not for both at the same time. Moreover, in the art, relatively thicker gate insulation layers of high-voltage transistor devices have to be formed in the course of gate patterning of other low-voltage FETs, which significantly complicates the overall patterning process.

In view of the above, there is need for techniques of manufacturing high-voltage FETs, in particular, integrated in the process flow of the manufacture of high-yield low-voltage FETs and possibly (FD)SOI FETs.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices and methods for fabricating the same, wherein a high-voltage FET is formed, in particular, within a process flow of forming a low-voltage bulk transistor device and/or an (FD) SOI FET comprising a channel formed in a thin semiconductor layer. The high-voltage FET may allow for an operation voltage of more than 10 V, in particular, more than 15 V, due to a thick gate insulation or gate dielectric layer (e.g., oxide) provided.

A method of forming a semiconductor device is provided including the steps of providing a semiconductor-on-insulator (SOI) substrate comprising a semiconductor bulk substrate, a buried insulation layer (e.g., a buried oxide layer) formed on the semiconductor bulk substrate and a semiconductor layer (i.e., active layer) positioned on the buried insulation layer, forming a first (high-voltage) transistor device, wherein forming the first transistor device comprises forming a channel region in the semiconductor bulk substrate and forming a gate insulation layer (i.e., a gate dielectric layer) over the channel region partially of a part of the buried insulation layer. The method of forming the gate insulation layer includes oxidizing a part of the semiconductor layer. Moreover, an additional insulation layer (e.g., an oxide layer) may be formed on the oxidized part of the semiconductor layer in order to further increase the thickness of the resulting gate insulation layer of the high-voltage transistor device. The method can be integrated in a process flow of forming another transistor device comprising a relatively thin gate insulation layer that does not comprise a part of the buried insulation layer and does not comprise an oxidized part of the semiconductor layer.

Furthermore, a method of forming a semiconductor device is provided including the steps of providing a semiconductor-on-insulator (SOI) substrate comprising a semiconductor bulk substrate, a buried insulation layer formed on the semiconductor bulk substrate and a semiconductor layer positioned on the buried insulation layer, forming a first (high-voltage) transistor device including forming a first channel region in the semiconductor bulk substrate, forming first raised source and drain regions on the semiconductor bulk substrate, oxidizing a part of the semiconductor layer, and forming a first gate insulation layer on the first channel region at least from (a) a part of the buried insulation layer, (b) the oxidized part of the semiconductor layer and (c) a first gate insulator formed over the oxidized part of the semiconductor layer by depositing and patterning a gate insulation layer, and forming a second transistor device including forming a second channel region in one of the semiconductor bulk substrate and the semiconductor layer, forming second raised source and drain regions on the one of the semiconductor bulk substrate and the semiconductor layer and forming a second gate insulation layer on the second channel region from the patterned gate insulation layer. The second transistor device may be a low-voltage bulk transistor device having a channel region formed in the semiconductor bulk substrate or a partially or fully depleted SOI transistor device having a channel region formed in the semiconductor layer and the second transistor device may be formed within the same process flow of forming the first transistor device.

A semiconductor device is provided including a semiconductor-on-insulator (SOI) substrate comprising a semiconductor bulk substrate, a buried insulation layer formed on the semiconductor bulk substrate and a semiconductor layer positioned on the buried insulation layer, and a first (high-voltage) transistor device, wherein the first transistor device includes a first channel region formed in the semiconductor bulk substrate and a first gate insulation layer formed over the first channel region and at least partially of a part of the buried insulation layer and an oxidized part of the semiconductor layer.

Furthermore, a semiconductor device is provided including a semiconductor-on-insulator (SOI) substrate comprising a semiconductor bulk substrate, a buried insulation layer formed on the semiconductor bulk substrate and a semiconductor layer positioned on the buried insulation layer, and a first (high-voltage) transistor device and a second transistor device (in particular, both formed in and on the SOI substrate), wherein the first transistor device includes a first channel region formed in the semiconductor bulk substrate, first raised source and drain regions formed on the semiconductor bulk substrate, and a first gate insulation layer formed on the first channel region at least from a part of the buried insulation layer and an oxidized part of the semiconductor layer, and the second transistor device includes a second channel region formed in one of the semiconductor bulk substrate and the semiconductor layer, second raised source and drain regions formed on the one of the semiconductor bulk substrate and the semiconductor layer and a second gate insulation layer formed on the second channel region from the patterned gate insulation layer. A third transistor device including a third channel region formed in the other one of the semiconductor bulk substrate and the semiconductor layer, third raised source and drain regions formed on the other one of the semiconductor bulk substrate and the semiconductor layer and a third gate dielectric layer formed on the third channel region may also be formed in and on the same SOI substrate. In any case, the first gate dielectric layer of the first (high-voltage) transistor device may include another oxide layer formed on the oxidized part of the semiconductor layer.

BRIEF DESCRIPTION OF THE DRAWINGS

The disclosure may be understood by reference to the following description taken in conjunction with the accompanying drawings, in which like reference numerals identify like elements, and in which.

Figure 1A:
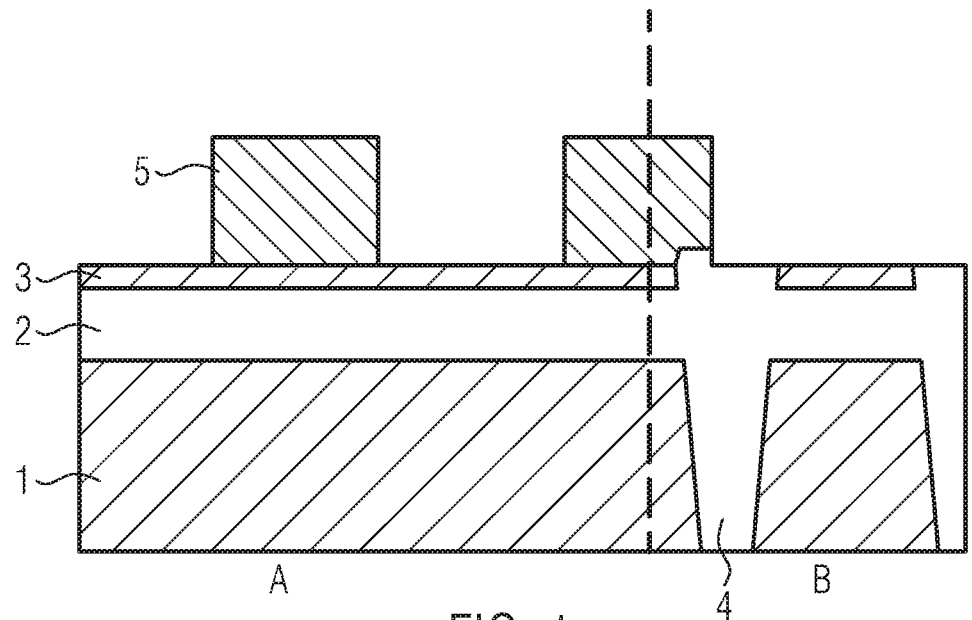
FIGS. 1a-1l illustrate a process of forming a semiconductor device comprising a high-voltage transistor device with a relatively thicker gate insulation layer and a low-voltage bulk transistor device on an SOI substrate, according to an illustrative example of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Generally, manufacturing techniques and semiconductor devices in which N-channel transistors and/or P-channel transistors and memory cells may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices and CMOS integrated circuit devices. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor (SOI) substrate.

The disclosure generally relates to a field effect transistor (FET) with a relatively thicker gate insulation layer that is formed using a buried insulation layer of an SOI wafer and additional insulating material, with the silicon layer above the buried insulation layer being doped heavily as a gate. More specifically, according to aspects of the invention, a high-voltage device that allows applying relatively high voltages, for example, voltages of some 10 V, particularly, more than 15 V, to the gate electrode of the transistor device is formed in a thin-silicon SOI wafer by using the buried insulation layer (e.g., a buried oxide layer) and additional insulating material (e.g., oxide material) as the gate insulation layer of the high-voltage device. In this manner, a high-voltage transistor device, a conventional high-yield low-voltage bulk transistor device, for example, operating at a voltage of below 2 V, and, possibly, an additional high-performance SOI transistor device may be formed on the same SOI wafer. The high-voltage FET can be a single gate, extended gate or zero gate transistor device, for example. With reference to FIGS. 1a-1l and 2, illustrative embodiments will now be described in more detail.

As shown in FIG. 1a, a semiconductor-on-insulator (SOI) substrate is provided comprising a semiconductor bulk substrate 1, a buried insulation (e.g., oxide) (BOX) layer 2 and a semiconductor or active layer 3. The semiconductor layer 3 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like. The semiconductor layer 3 may suitably be doped for forming a channel region of a P-channel or N-channel transistor. In FDSOI applications, the semiconductor layer 3 may not be doped.

The BOX layer 2 may comprise silicon (di)oxide, for example, borosilicate glass. The BOX layer 2 may be composed of different layers and one of the different layers may comprise borophosphosilicate glass (BPSG) or an $SiO_2$-compound comprising boron. The semiconductor bulk substrate 1 may be a silicon substrate, in particular, a single crystal silicon substrate. Other materials may be used to form the semiconductor bulk substrate 1, such as, for example, germanium, silicon germanium, gallium phosphate, gallium arsenide, etc. The thickness of the semiconductor layer 3 may be in the range of 5-30 nm, in particular, 5-15 nm, and the thickness of the BOX layer 2 may be in the range of 10-50 nm, in particular, 10-30 nm and, more particularly, 15-25 nm.

An area A and an area B may be defined in the SOI substrate. The areas A and B are separated from each other by an insulation region 4, for example, a shallow trench isolation (STI) region. The STI region 4 may be formed by etching a trench in the semiconductor bulk substrate 1 and filling the trench by some insulating material, for example, some oxide material. The oxide material may be a high-density plasma oxide. Prior to filling the trench with the insulating material, a liner made of an oxide or silicon nitride material may be formed at sidewalls of the trench to facilitate gap-free filling. In the area A, a high-voltage transistor device will be formed and, in the area B, a bulk transistor device that is not suitable for high-voltage operation with a voltage applied to the gate of, for example, more than 2 or 4 V, will be formed, both with a channel region formed in the semiconductor bulk substrate 1. Actually, the operating voltage depends on the particular choice of the gate insulation layer. For example, in a single-gate configuration, an operating voltage of about 0.5-0.7 V, in an extended-gate configuration, an operating voltage of about 1.5-2.0 V, and in a z-gate configuration, an operating voltage of about 2.5-3.5 may be chosen for the bulk transistor device formed in the area B.

Figure 1B:
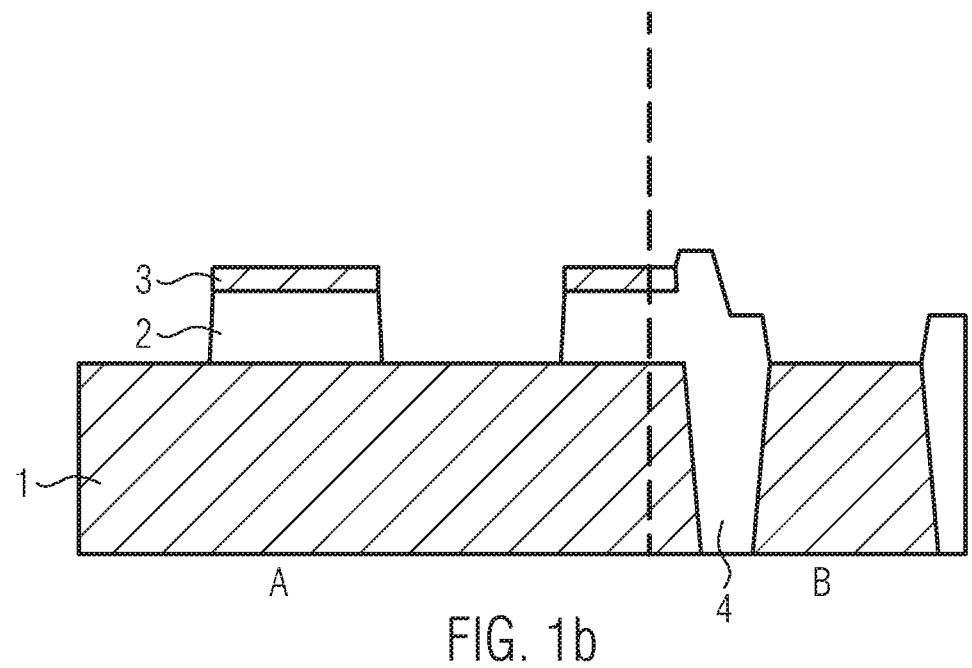

A mask layer 5 is formed above the SOI substrate, i.e., above the semiconductor layer 3, and patterned in order to form a high-voltage transistor device comprising a relatively thicker gate insulation layer. The mask layer 5 may comprise a nitride material and it may be patterned by means of standard lithography techniques. FIG. 1b shows the configuration after etching the semiconductor layer 3 and the BOX layer 2 using the mask layer 5 as an etching mask. In the area B, the semiconductor layer 3 and the BOX layer 2 are removed for the formation of a conventional bulk transistor device. Note that, in the processing stage shown in FIG. 1b, the mask layer 5 is already removed.

Figure 1C:
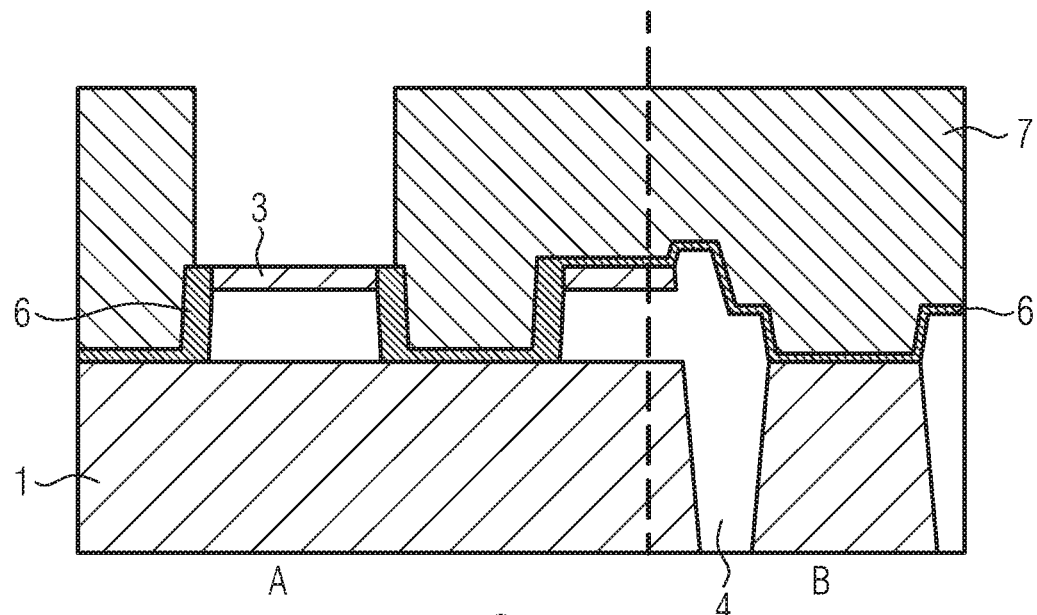

As shown in FIG. 1c, a nitride layer 6, for example, a silicon nitride layer 6 is formed over the structure shown in FIG. 1b. After formation of the nitride layer 6, another mask layer 7 is formed, for example, of an appropriate oxide material, and patterned by lithography. The mask layer 7 is used as an etching mask in an etching process performed in order to remove the nitride layer 6 from the semiconductor layer 3 in the area A.

Figure 1D:
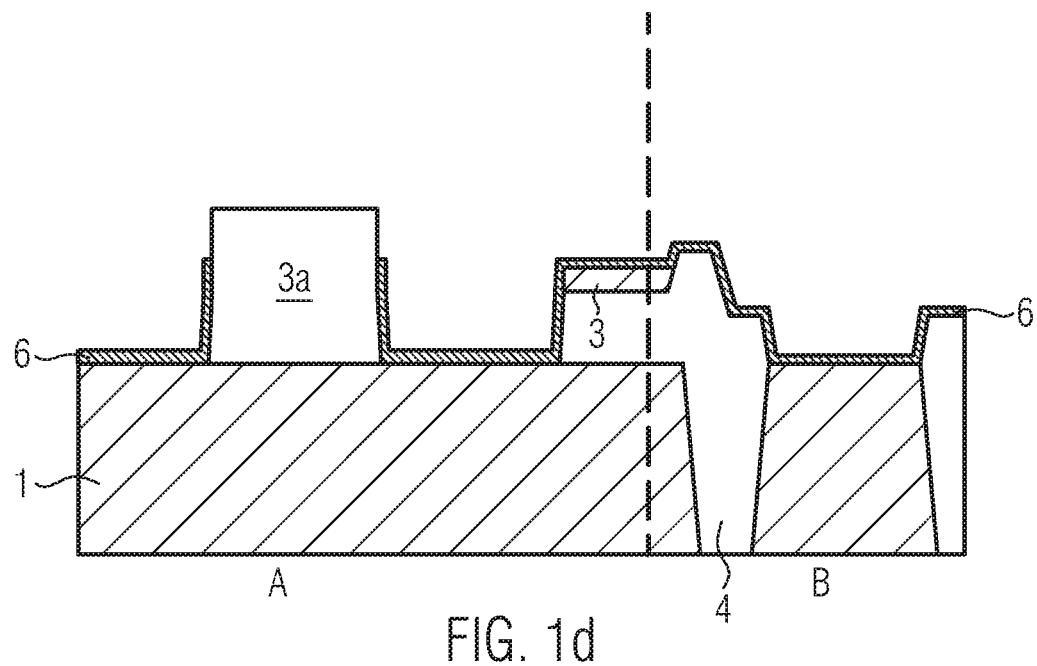
Figure 1E:
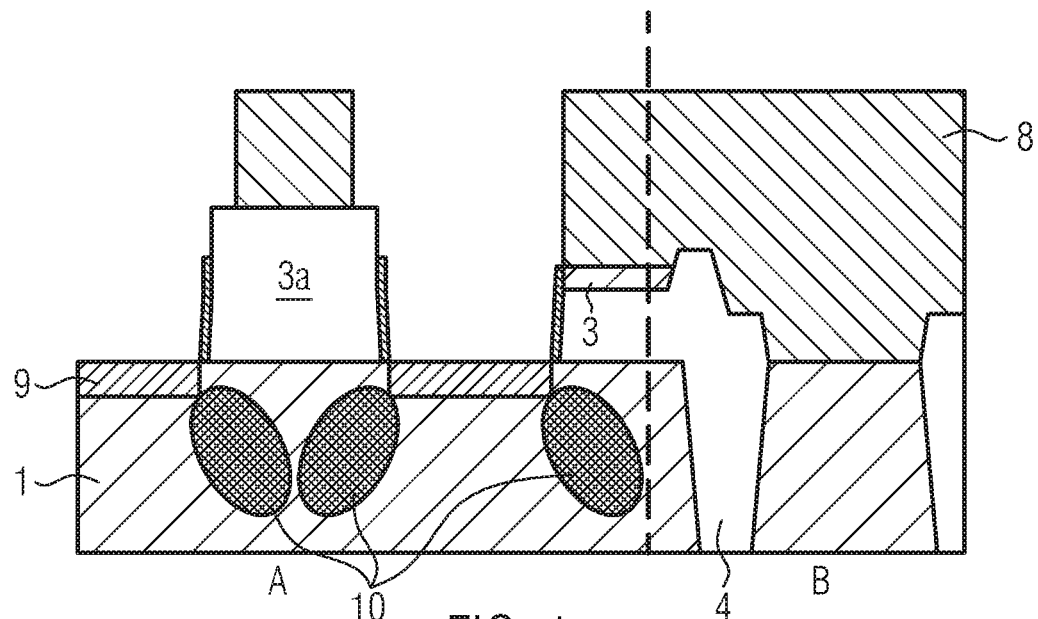

Oxidation of the semiconductor layer 3 exposed in the area A is performed in order to form a relatively thick gate insulation layer. During the oxidation process, the exposed semiconductor layer 3 is substantially completely consumed. The thickness of the resulting regrown raised oxide region 3a, for example, a silicon oxide region, is about 2 times the volume of the semiconductor layer 3. Additional insulation material (e.g., oxide) may be deposited on the regrown oxide if desired. The resulting structure after removal of the mask layer 7 and the oxidation regrowth is illustrated in FIG. 1d. The raised oxide region 3a may have a thickness in the range of about 25-60 nm or even more if desired. Different from the art, the thickness of the high-voltage transistor device formed in the area A is not limited to the thickness of the BOX layer 2 of the SOI substrate.

Next, the horizontal portions of the nitride layer 6 are removed from the surface of the semiconductor layer in the area A and an implantation mask 8 is formed over areas A and B. Using the implantation mask 8, lightly-doped source/drain regions 9 and halo regions 10 are formed in the area A (see FIG. 1*e*). A dose concentration in the lightly-doped source/drain regions 9 and halo regions 10 in the range of $10^{10}$ to $10^{14}$ cm$^{-2}$ may be chosen. Boron, boron fluoride or indium may be chosen for forming p$^+$ implanted lightly-doped source/drain regions 9 and halo regions 10 in the semiconductor bulk substrate 1 in the area A.

Figure 1F:
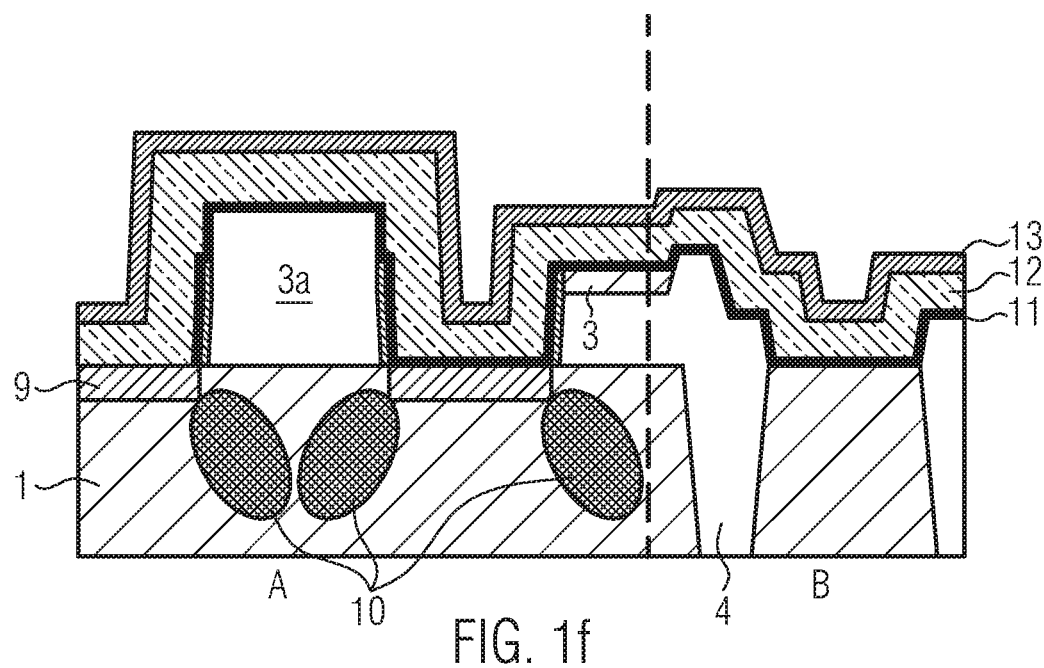

Next, gate stacks are formed in the areas A and B. As shown in FIG. 1*f*, a thin gate dielectric layer 11 is formed on the exposed surfaces of the structure shown in FIG. 1*e*. In particular, the gate insulation layer 11 is formed on free surfaces of the raised oxide region 3*a* in the area A and the exposed semiconductor layer 3 in the area B. The gate insulation layer 11 may have thickness of 2-5 nm, for example. The gate insulation layer 11 may be a high-k material layer with a dielectric constant k of more than 5, for example. This high-k material layer may comprise dielectric materials such as hafnium oxide (HfO$_2$), hafnium silicon oxide (HfSiO), tantalum oxide (Ta$_2$Os), strontium titanium oxide (SrTiO$_3$), zirconium oxide (ZrO$_2$), etc. Alternatively, the gate insulation layer 11 may be formed of silicon oxide.

On the gate dielectric layer 11, a gate layer 12 is formed. The gate layer 12 may comprise a metal-containing layer. The metal-containing (metal gate) layer of the gate layer 12 may comprise at least one of titanium nitride (TiN), tantalum nitride (TaN), tantalum (Ta), tungsten (W), for example. The metal-containing layer 12 may be relatively thin with a thickness below 50 nm, in particular, below 30 nm. The gate layer 12 may comprise or consist of an amorphous silicon or polysilicon material. A work function adjusting layer may be formed between the gate dielectric layer 11 and the gate layer 12. For example, the work function adjusting layer may comprise a metal-containing material that is provided in the form of a titanium nitride material or an aluminum oxide layer and the work function adjusting layer may additionally comprise a lanthanum species.

Figure 1G:
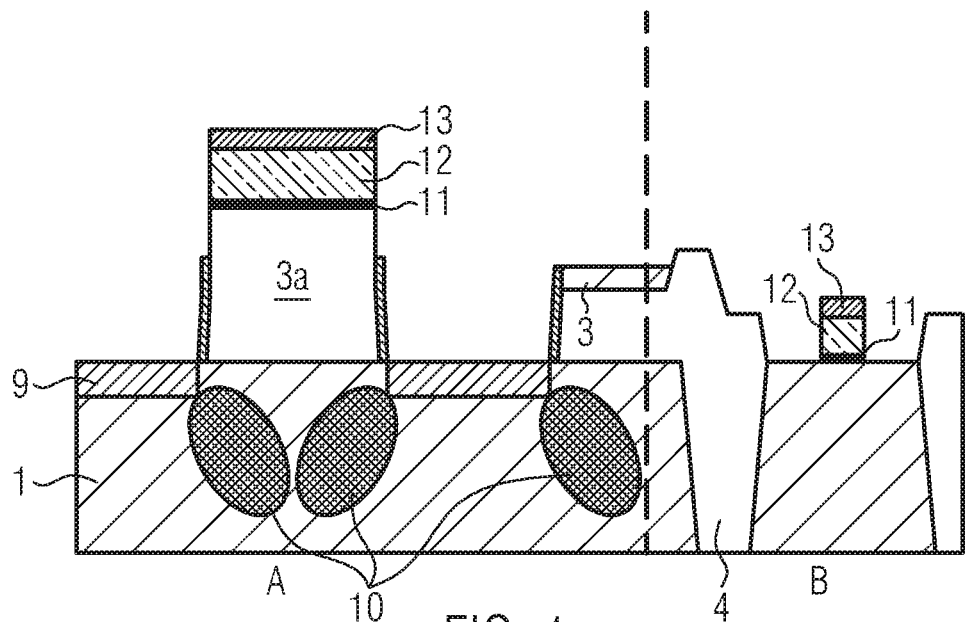

For example, after depositing the metal-containing layer, a semiconductor layer may be formed onto the metal-containing layer. In some embodiments, the semiconductor layer may conveniently comprise silicon. According to a particular embodiment, the semiconductor layer comprises doped polycrystalline silicon in order to form a high-k metal-poly-gate. After the formation of the gate layer 12, a cap layer 13 is formed. The cap layer 13 may comprise or consist of a nitride material. Gate structures result from conventional gate patterning of the gate dielectric layer 11, the gate layer 12 and the cap layer 13, as illustrated in FIG. 1*g*. The gate length may be smaller than the length defined by the originally patterned BOX layer 2.

Figure 1H:
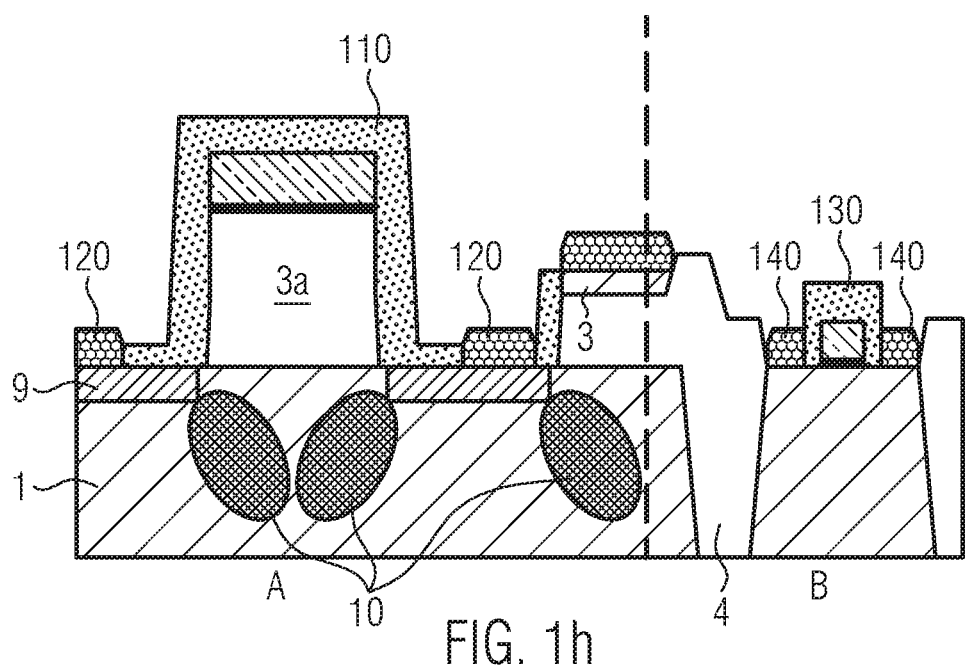

In the processing step shown in FIG. 1*h*, sidewall spacers 110 and 130 are formed on the sidewalls of the gate stacks in the areas A and B and raised source and drain regions 120 and 140 are also formed. The sidewall spacers 110 and 130 may be made of an oxide or nitride material, after masking the relevant areas, for example. The raised source and drain regions 120 and 140 are formed, for example, by epitaxially growing a semiconductor material on the lightly doped source and drain regions 9 in the area A and on the exposed semiconductor layer 3 in the area B, respectively. The grown semiconductor material that, for example, comprises silicon or silicon germanium, is properly doped, for example, by ion implantation or by in situ doping. For example, the raised source and drain regions 120 in the area A comprise n$^+$ dopants to provide for an N-channel FET. Phosphorous or arsenic may be used in the ion implantation process or the in situ doping process. The cap layer 13 protects the gate layers 12 of the gate stacks in the areas A and B during the process of forming the raised source and drain regions 120 and 140.

Figure 1I:
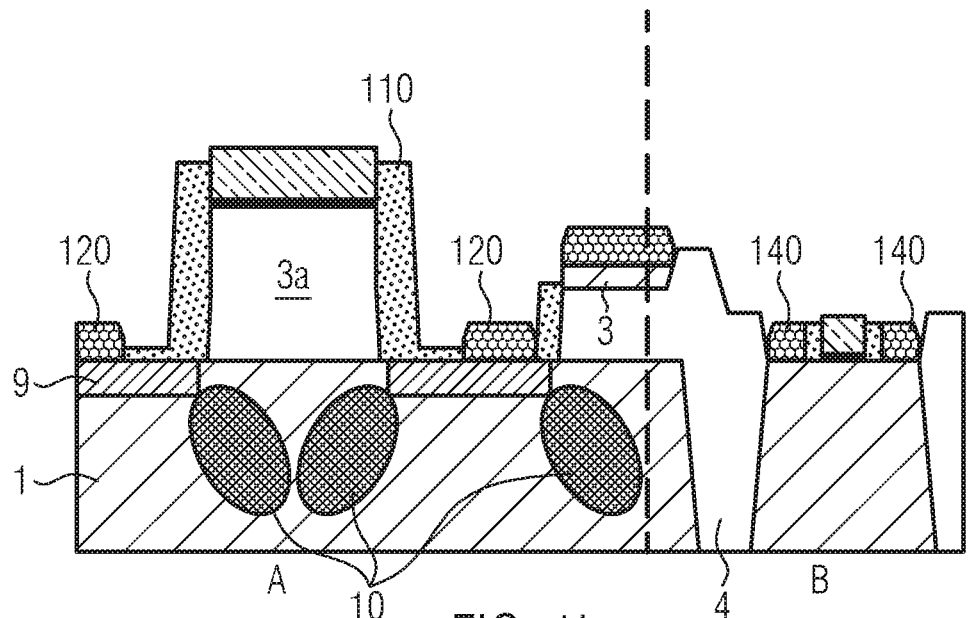

Next, the cap layer 13 is removed to expose the gate layers 12, as illustrated in FIG. 1*i*. During this process, horizontal portions of the sidewall spacer 110 that are formed on the semiconductor bulk substrate 1 may also be removed to expose portions of the lightly doped source/drain regions 9 in the area A.

Figure 1J:
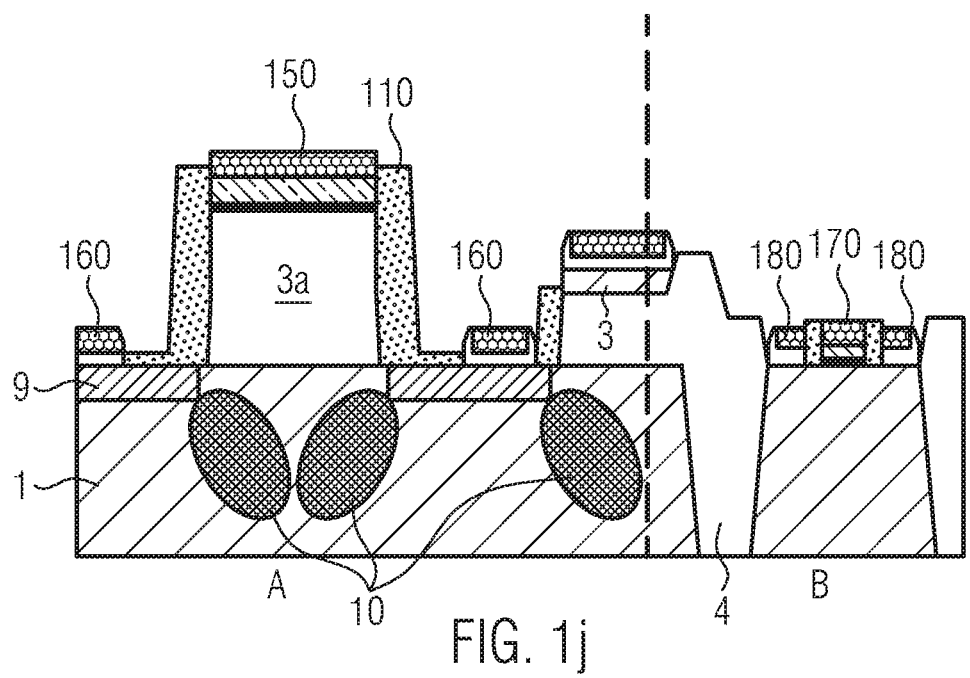

As shown in FIG. 1*j*, a silicidation process may be formed to obtain silicided source and drain regions 160 and 180 and silicided gates 150 and 170 of low electrical resistance. The silicide regions 150, 160, 170 and 180 may comprise nickel silicide, nickel/platinum silicide or cobalt silicide and the like.

Figure 1K:
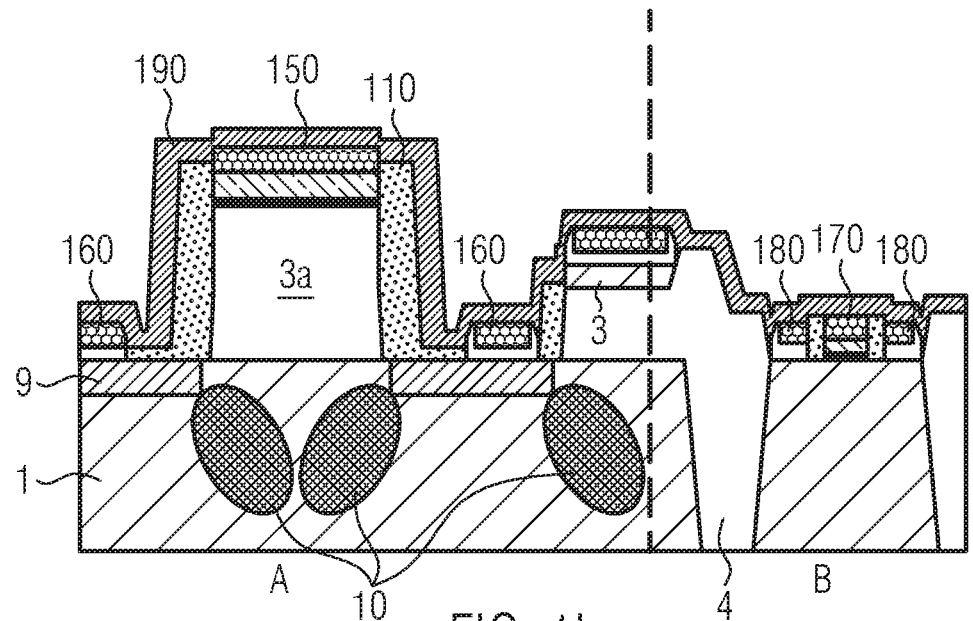

In order to enhance the carrier mobility in the channel regions, a strained material layer 190 (depending on the kind of transistor formed—P-channel or N-channel) may be formed over the structure shown in FIG. 1*j*. The resulting structure is illustrated in FIG. 1*k*. In the described embodiment, the high-voltage FET formed in the area A is an N-channel FET. If an N-channel FET is formed in the area B, the same tensile material layer 190 may be formed over the entire structure shown in FIG. 1*j*.

Figure 1L:
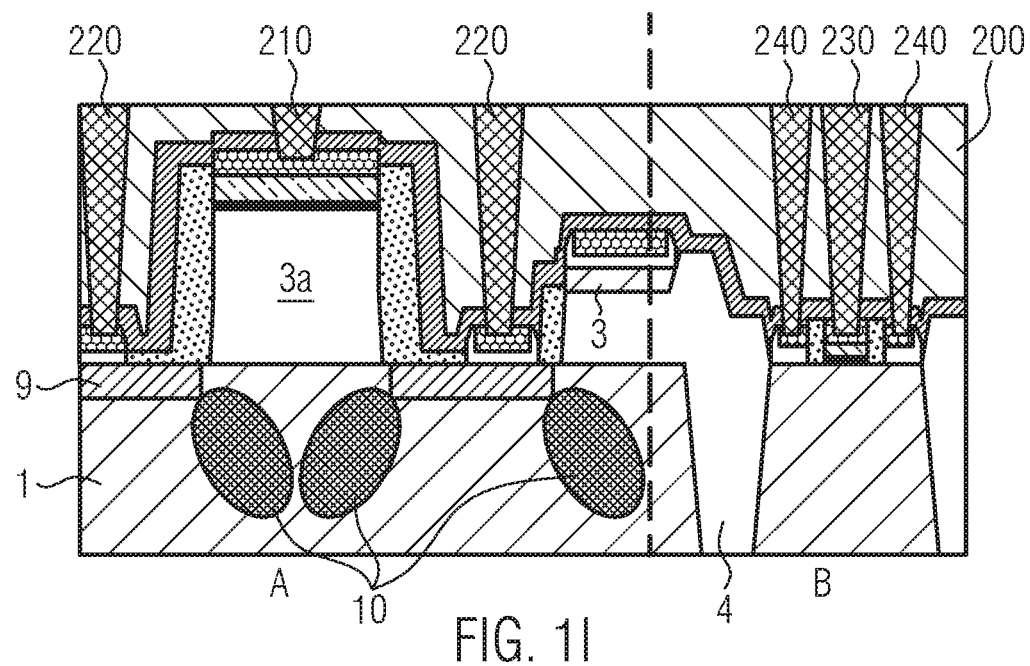

In the processing stage shown in FIG. 1*l*, an interlayer dielectric (ILD) 200 is formed and contacts 210, 230 to the silicided gates 150, 170 and contacts 220 to the source and drain regions 160 in the area A and contacts 240 to the source and drain regions 180 in the area B are formed in the ILD 200 and through the strained material layer 190.

The ILD 200 may include a deposited silicon oxide, silicon nitride or silicon oxynitride, or another material suitable for providing electrical isolation between semiconductor devices. The ILD layer 200 may be blanket-deposited using, for example, plasma enhanced chemical vapor deposition (PECVD), a low pressure chemical vapor deposition (LPCVD), or a CVD process. In one example, the ILD 200 includes a silicon oxide material and has a thickness of about 30 nm to about 1 micron, for example a thickness of about 60-500 nm. In particular, the ILD 200 may consist of or comprise an ultra-low-k (ULK) material with a dielectric constant k<2.8 or k of at most 2.4. The formation of the contacts 210, 220, 230 and 240 can be achieved by forming vias in the ILD 200 and filling the same with some contact material, for example, aluminum or tungsten.

As a result, a high-voltage transistor device, for example, allowing voltages of at least more than 10 V or 15 V applied to the gate, is formed in the area A, and a conventional low-voltage bulk transistor device is formed in the area B. It should be noted that, compared to FETs of the art that use a BOX layer as a gate insulation layer, high operation voltages, in principle, are allowed for the herein disclosed high-voltage transistor devices due to the increased thickness of the gate insulation layer (e.g., oxide) caused by the additional oxidation process described above and possibly another insulation layer that may be formed on the oxidized part of the semiconductor layer.

Figure 2:
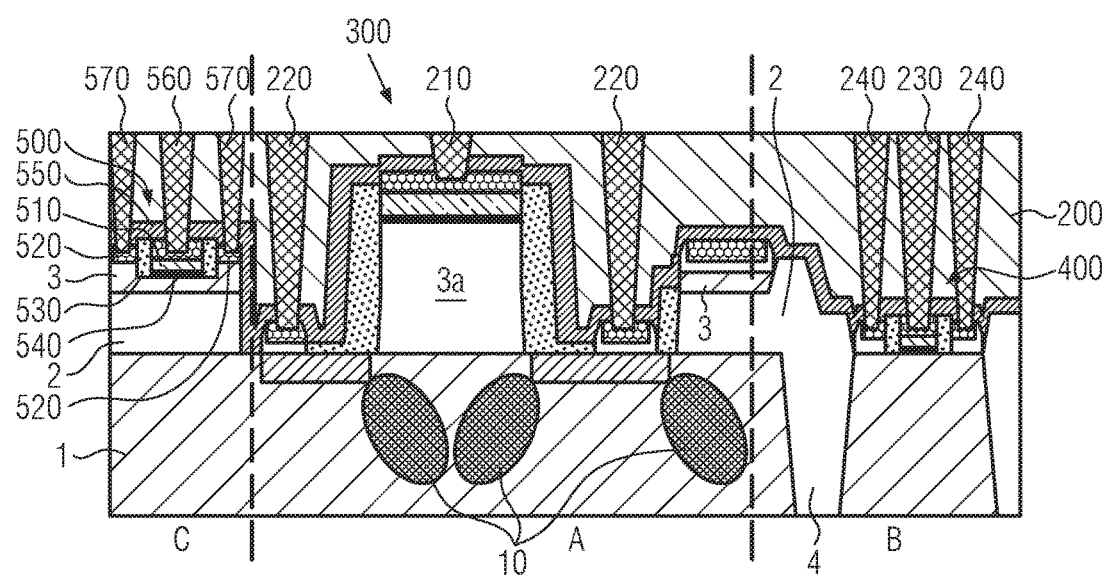
FIG. 2 illustrates a semiconductor device comprising a high-voltage transistor device with a relatively thicker gate insulation layer, a low-voltage bulk transistor device and an SOI transistor device, according to another illustrative example of the present disclosure.

Besides integration of the manufacturing of a high-voltage transistor device in the process flow of manufacturing a bulk transistor device having a channel formed in a semiconductor bulk substrate and suitable for operation at voltages of 2 V, for example, herein, integration of the manufacturing of a high-voltage transistor device in the process flow of manufacturing an SOI transistor device, in particular, a partially depleted or fully depleted (FDSOI) transistor device is disclosed. For example, an (FD)SOI transistor device, a low-voltage (for example, with an operation voltage below 2 V) bulk transistor device and a high-voltage transistor device with a thick gate oxide can be formed within the same process flow. Integrated manufacturing can be performed without the need for additional complex patterning procedures. The resulting semiconductor device is shown in FIG. 2. As described above with reference to FIGS. 1a-1l, in an area A of an SOI substrate, a high-voltage transistor device 300 with a thick gate oxide 3a is formed and, in an area B, a low-voltage bulk transistor device 400 is formed. The SOI substrate may be the same as described above and the high-voltage transistor device 300 and the bulk transistor device 400 may be the same as described above. Additionally, an SOI FET, for example, an FDSOI FET 500 is formed in an area C of the SOI substrate.

In the configuration shown in FIG. 2, the channel region of the low-voltage bulk transistor device 400 is formed in the semiconductor bulk substrate 1. The channel region of the high-voltage transistor device 300 having the thick gate oxide 3a is also formed in the semiconductor bulk substrate 1 of the SOI substrate. The semiconductor bulk substrate 1 is suitably doped in the areas A and B in order to provide the channel regions of the high-voltage transistor device 300 and the low-voltage bulk transistor device 400. Both transistor devices 300 and 400 have raised source and drain regions and may have gate electrodes formed of the same material and/or of the same material layer within the same patterning process.

The SOI FET 500 is formed above the BOX layer 2 of the SOI substrate. The channel region of the SOI FET 500 is formed in the suitably doped semiconductor layer 3 of the SOI substrate. The SOI FET 500 comprises a silicided gate 510, silicided source and drain regions 520, sidewall spacers 530 and a gate insulation layer 540. Contacts 560 and 570 to the silicided gate 510 and the source and drain regions 520, respectively, are formed in the ILD 200. The gate dielectric 540 may be a thin oxide layer, for example, comprising $SiO_2$, $HfO_2$, $HfSiO_4$, or the like. Further, the SOI FET 500 comprises, depending on the charged carrier species of the channel, a tensile or compressive material layer 550 that may be formed by depositing tensile or compressive plasma enhanced nitride (TPEN or CPEN) using plasma enhanced chemical vapor deposition (PECVD). The individual layers of the SOI FET 500 can be formed in the same processing steps as the formation of the respective layers of the high-voltage transistor device 300 and the bulk transistor device 400. In particular, the shown three FETs may comprise gates made of the same material. The gates may comprise metal and (poly)silicon layers.

It is, furthermore, noted that the lower surface of the gate of the high-voltage transistor device 300 is positioned higher than the lower surfaces of the gates of the FETs 400 and 500 (see FIG. 2). For example, the lower surface of the gate of the high-voltage transistor device 300 may be positioned about 5-35 nm higher than the one on the SOI FET 500. In the example shown in FIG. 2, the thickness of the raised gate oxide 3a of the high-voltage transistor device 300 may lie in the range of 30-60 nm or even more. In particular, different from the art, the thickness of the high-voltage transistor device 300 is not limited to the thickness of the BOX layer 2 of the SOI substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device, comprising the steps of:
    providing a semiconductor-on-insulator (SOI) substrate comprising a semiconductor bulk substrate, a buried insulation layer formed on said semiconductor bulk substrate and a semiconductor layer positioned on said buried insulation layer; and
    forming a first transistor device comprising forming a channel region in said semiconductor bulk substrate and forming a gate insulation layer over said channel region partially of a part of said buried insulation layer, and wherein forming said gate insulation layer comprises oxidizing a part of said semiconductor layer.

2. The method of claim 1, wherein forming said gate insulation layer further comprises forming another insulation layer on said oxidized part of said semiconductor layer.

3. The method of claim 1, wherein forming said first transistor device further comprises forming a gate electrode over said gate insulation layer by depositing a gate layer over said oxidized part of said semiconductor layer and patterning said deposited gate layer.

4. The method of claim 1, wherein forming said first transistor device further comprises forming raised source and drain regions over said semiconductor bulk substrate.

5. The method of claim 1, wherein said gate insulation layer has a thickness of more than 20 nm.

6. The method of claim 1, wherein forming said first transistor device further comprises forming a mask layer over said oxidized part of said semiconductor layer and implanting ions in said semiconductor bulk substrate to form lightly doped drain/source regions and halo regions in said semiconductor bulk substrate using said mask layer as an implantation mask.

7. The method of claim 1, further comprising forming a second transistor device on the same SOI substrate as said first transistor device, and wherein forming said first transistor device comprises forming a first gate over said gate insulation layer and forming said second transistor device comprises forming a second gate and wherein forming said first and second gates comprises depositing a gate layer over said semiconductor bulk substrate and patterning said gate layer.

8. A method of forming a semiconductor device, comprising the steps of:
    providing a semiconductor-on-insulator (SOI) substrate comprising a semiconductor bulk substrate, a buried insulation layer formed on said semiconductor bulk substrate and a semiconductor layer positioned on said buried insulation layer;

forming a first transistor device comprising:
  forming a first channel region in said semiconductor bulk substrate, forming first raised source and drain regions on said semiconductor bulk substrate, oxidizing a part of said semiconductor layer, and forming a first gate insulation layer on said first channel region at least from (1) a part of said buried insulation layer, (2) said oxidized part of said semiconductor layer and (3) a first gate insulator formed over said oxidized part of said semiconductor layer by depositing and patterning a gate insulation layer; and forming a second transistor device comprising:
  forming a second channel region in one of said semiconductor bulk substrate and said semiconductor layer, forming second raised source and drain regions on said one of said semiconductor bulk substrate and said semiconductor layer and forming a second gate insulation layer on said second channel region from said patterned gate insulation layer.

9. The method of claim 8, wherein forming said first gate insulation layer comprises forming another insulation layer on said oxidized part of said semiconductor layer.

10. The method of claim 8, further comprising forming a third transistor device comprising:
  forming a third channel region in the other one of said semiconductor bulk substrate and said semiconductor layer, forming third raised source and drain regions on said other one of said semiconductor bulk substrate and said semiconductor layer and forming a third gate insulation layer on said third channel region from said patterned gate insulation layer.

11. The method of claim 10, further comprising forming a first gate electrode on said first gate insulation layer comprising depositing and patterning a gate layer, forming a second gate electrode on said second gate insulation layer at least partially from said patterned gate layer and forming a third gate electrode on said third gate insulation layer at least partially from said patterned gate layer.

12. The method of claim 8, wherein forming said first transistor device further comprises forming a mask layer over said oxidized part of said semiconductor layer and implanting ions in said semiconductor bulk substrate to form lightly doped drain/source regions and halo regions in said semiconductor bulk substrate using said mask layer as an implantation mask.

* * * * *